US007142614B2

(12) United States Patent
Takinami et al.

(10) Patent No.: US 7,142,614 B2
(45) Date of Patent: Nov. 28, 2006

(54) SIGNAL GENERATING CIRCUIT FOR GENERATING A REFERENCE PHASE SIGNAL AND A QUADRATURE SIGNAL

(75) Inventors: Koji Takinami, Katano (JP); Hisashi Adachi, Mino (JP); Makoto Sakakura, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 764 days.

(21) Appl. No.: 10/345,385

(22) Filed: Jan. 16, 2003

(65) Prior Publication Data

US 2003/0133517 A1   Jul. 17, 2003

(30) Foreign Application Priority Data

Jan. 17, 2002   (JP)   ............... 2002-008822

(51) Int. Cl.
| | |
|---|---|
| *H04L 27/00* | (2006.01) |
| *H03B 21/00* | (2006.01) |
| *H03K 3/00* | (2006.01) |
| *H03K 5/13* | (2006.01) |
| *H03K 23/00* | (2006.01) |
| *H03K 25/00* | (2006.01) |

(52) U.S. Cl. .................... 375/295; 331/42; 327/255
(58) Field of Classification Search ................ 375/302, 375/306–8, 322, 326, 295; 382/209, 211; 359/10, 11, 238, 264, 278–9, 210, 211; 327/255; 331/37, 42; 455/313, 318–320
See application file for complete search history.

(56) References Cited

U.S. PATENT DOCUMENTS

| 6,011,816 | A | * | 1/2000 | Sanielevici et al. ......... 375/324 |
|---|---|---|---|---|
| 6,133,804 | A | * | 10/2000 | Wagner et al. .............. 332/127 |
| 6,404,293 | B1 | * | 6/2002 | Darabi et al. ................ 331/37 |
| 6,609,239 | B1 | * | 8/2003 | Xavier ........................ 716/10 |
| 6,631,170 | B1 | * | 10/2003 | Gu .............................. 375/316 |
| 2002/0064237 | A1 | * | 5/2002 | Shibata ....................... 375/302 |
| 2003/0133517 | A1 | * | 7/2003 | Takinami et al. ........... 375/322 |
| 2003/0206600 | A1 | * | 11/2003 | Vankka ....................... 375/261 |

OTHER PUBLICATIONS

Wegerif et al. "An integrated cmos image-rejection mixer system for low jitter secondary frequency references" 1993 IEEE International Symposium on Circuits and Systems, May 3-6, 1993, pp. 1010-1013.*
Behzad Razavi: "RF Microelectronics" The Complete Electric Engineer's Guide to RF Microelectronics, ISBN: 0138875715, published: Nov. 6, 1997, Chapter 5, pp. 138-139.

* cited by examiner

*Primary Examiner*—Mohammed Ghayour
*Assistant Examiner*—Aslan Ettehadieh
(74) *Attorney, Agent, or Firm*—Wenderoth, Lind & Ponack, L.L.P.

(57) ABSTRACT

In a signal generating circuit SG1, a 90-degree divider 3 generates, from a local oscillation signal $S_{LO}$ supplied through an input terminal 1, an intermediate reference phase signal $IS_{REF}$ and an intermediate quadrature signal $IS_{QR}$ orthogonal in phase to the intermediate reference phase signal $IS_{REF}$ for output to mixers 6 and 7, respectively. A shifter 4 shifts the phase of the local oscillation signal supplied through an input terminal 2 by a predetermined amount to generate a shift signal $S_{SFT}$ for output through a divider 5 to the mixers 6 and 7. The mixer 6 mixes the input intermediate reference phase signal $IS_{REF}$ and the input shift signal $S_{SFT}$ to generate a reference phase signal $S_{REF}$. The mixer 7 mixes intermediate quadrature signal $IS_{QR}$ and the input shift signal $S_{SFT}$ to generate a quadrature signal $S_{QR}$. With this, it is possible to provide a signal generator capable of generating highly-accurate, high-frequency reference phase signals and quadrature signals.

22 Claims, 11 Drawing Sheets

F I G. 9
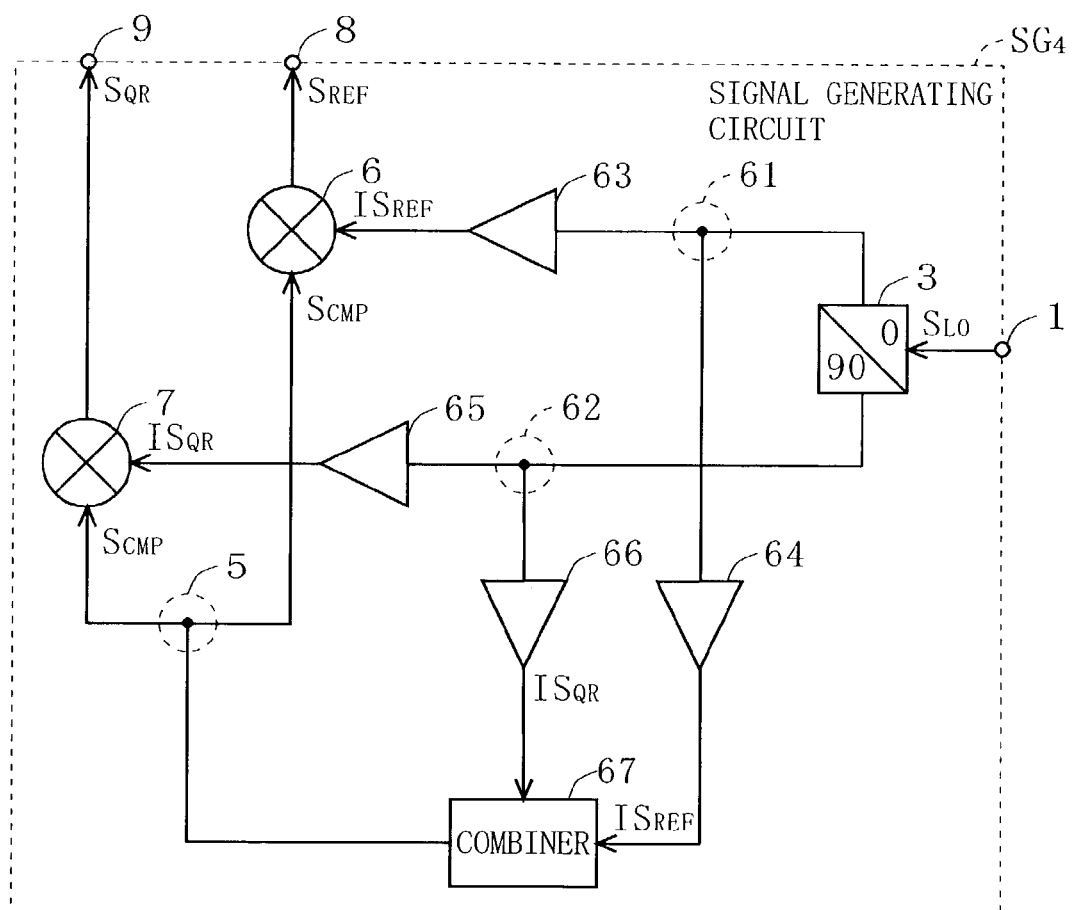

SIGNAL GENERATING CIRCUIT FOR GENERATING A REFERENCE PHASE SIGNAL AND A QUADRATURE SIGNAL

BACKGROUND OF THE INVENTION

1. Field of the Invention

The present invention relates to signal generating circuits and, more specifically, to a signal generating circuit that generates two signals differed in phase by 90 degrees from each other (hereinafter referred to as a reference phase signal and a quadrature signal, respectively).

2. Description of the Background Art

Wireless communications devices in recent years often incorporate a quadrature modulator, a quadrature demodulator, or an image rejection mixer. These components require the above-mentioned reference phase signal and quadrature signal.

FIG. 12 is a block diagram illustrating the circuit structure of a general quadrature modulator. In FIG. 12, the quadrature modulator includes a local oscillator 101, a 90-degree divider 102, two input terminals 103 and 104, two mixers 105 and 106, a combiner 107, and an output terminal 108.

The local oscillator 101 generates a local oscillation signal $S_{LO}$ for output to the 90-degree divider 102. Here, for the convenience of descriptions of embodiments, an oscillation frequency $f_c$ of the local oscillation signal 101 is taken as $f_{c1}$. The 90-degree divider 102 generates a reference phase signal $S_{REF}$ and a quadrature signal $S_{QR}$ from the received local oscillation signal $S_{LO}$. Here, the reference phase signal $S_{REF}$ and the quadrature signal $S_{QR}$ ideally are different in phase by 90 degrees and are equal in amplitude to each other. This reference phase signal $S_{RF}$ is supplied to the mixer 105, and this the quadrature signal $S_{RA}$ is supplied to the mixer 106.

Three exemplary implementations of the 90-degree divider 102 are described below with reference to FIGS. 13 through 15. FIG. 13 is a schematic diagram illustrating the circuit configuration of an RC shifter, which is a first exemplary implementation of the 90-degree divider 102. In FIG. 13, the RC shifter includes an input terminal 201, a divider 202, a serial capacitor 203, a parallel resistor 204, a serial resistor 205, a parallel capacitor 207, and two output terminals 207 and 208. In the above-structured RC shifter, when the above-mentioned local oscillation signal $S_{LO}$ is supplied to the input terminal 201, the above-mentioned reference phase signal $S_{REF}$ and quadrature signal $S_{QR}$ are output from the output terminals 207 and 208, respectively. A 90-degree divider implemented by the above-structured RC shifter is disclosed in, for example, "RF Microelectronics" authored by Behzad Razavi, p138.

FIG. 14 is a schematic diagram illustrating the circuit configuration of a polyphase filter, which is a second implementation of the 90-degree divider 102. In FIG. 14, the polyphase filter includes two input terminals 211 and 212, four resistors 213 through 216, four capacitors 217, 218, 219, and 2110, and four output terminals 2111 through 2114. In the above-structured polyphase filter, the input terminals 211 and 212 are supplied with a set of differential signals. This set of differential signals is generated from the above-mentioned local oscillation signal $S_{LO}$. One differential signal is supplied to the input terminal 211 and, in general, is equal in phase to the local oscillation signal $S_{LO}$. The other differential signal is supplied to the input terminal 212 and, in general, has a reverse phase of the one differential signal. With such differential signals, the above-mentioned reference phase signal $S_{RF}$ and quadrature signal $S_{QF}$ are output from the output terminals 2111 and 2113, respectively. These two signals $S_{REF}$ and $S_{QR}$ are also output from the output terminals 2112 and 2114, respectively. As such, the above-structured polyphase filter includes the input terminals 211 and 212 that receive differential signals, and therefore is suitable for a semiconductor integrated circuit often using a differential circuit.

Furthermore, two or more polyphase filters of FIG. 14 can be connected in series as illustrated in FIG. 15 to widen the band of the 90-degree divider 102.

Referring back to FIG. 12, the mixers 105 and 106 are further supplied with a baseband signal $S_{BB}$ through the input terminals 103 and 104. The mixer 105 mixes the input reference phase signal $S_{REF}$ and the input baseband signal $S_{BB}$ to generate a reference phase modulated signal $MS_{REF}$ for output to the combiner 107. The mixer 106 mixes the input quadrature signal $S_{QR}$ and the input baseband signal $S_{BB}$ to generate a quadrature modulated signal $MS_{QR}$ that is orthogonal in phase to the reference phase modulate signal $MS_{REF}$. This quadrature modulated signal $MS_{QR}$ is also output to the combiner 107.

The combiner 107 combines the input reference phase modulated signal $MS_{REF}$ and the quadrature modulated signal $MS_{QR}$ to generate a composite signal $S_{MP}$. With this combining, image components are rejected in the composite signal $S_{MP}$. Here, a ratio of rejection of image components depends to a large degree on a difference in amplitude and/or phase occurring in the 90-degree divider 102. Therefore, the 90-degree divider 102 incorporated in a quadrature modulator has to be able to generate highly-accurate reference phase signal $S_{RF}$ and quadrature signal $S_{QR}$ that are equal in amplitude and highly orthogonal to each other.

Note that a quadrature demodulator performs operations in reverse to those of the quadrature modulator, and is therefore not described or illustrated herein.

FIG. 16 is a schematic diagram illustrating the circuit configuration of a general image rejection mixer. In FIG. 16, the image rejection mixer is different from the quadrature modulator of FIG. 12 only in that the two input terminals 103 and 104 are replaced by a single input terminal 111 and a 90-degree divider 112. Therefore, in FIG. 16, components equivalent in structure to those in FIG. 12 are provided with the same reference numbers.

The input terminal 111 is given an intermediate frequency (IF) signal $S_{IF}$, and is then input to the 90-degree divider 112. As with the 90-degree divider 102, the 90-degree divider 112 generates a reference phase intermediate frequency (IF) signal $IFS_{REF}$ and a quadrature intermediate frequency (IF) signal $IFS_{QR}$ from the input IF signal $S_{IF}$. Here, the reference phase IF signal $IFS_{REF}$, and the quadrature IF signal $IFS_{QR}$ are different in phase by 90 degrees and equal in amplitude to each other. This reference phase IF signal $IFS_{REF}$ is supplied to the mixer 105, while the quadrature IF signal $IFS_{QR}$ is output to the mixer 106.

The mixer 105 mixes the input reference phase IF signal $IFS_{REF}$ and the input reference phase signal $S_{REF}$ to generate a reference phase modulated signal $MS_{REF}$ for output to the combiner 107. The mixer 106 mixes the input quadrature IF signal $IFS_{QR}$ and the input quadrature signal $S_{QR}$ to generate a quadrature modulated signal $MS_{QR}$ for output to the combiner 107. The combiner 107 combines the input reference phase modulated signal $MS_{REF}$ and the input quadrature modulated signal $MS_{QR}$ to generate a composite signal $S_{MP}$.

However, the above-structured 90-degree divider 102 has a problem such that, accurate reference phase signal $S_{REF}$ and quadrature signal $S_{QR}$ cannot be generated as the local oscillation signal $S_{LO}$ becomes higher in frequency. More specifically, for the purpose of making the 90-degree divider 102 structured as illustrated in any of FIGS. 13 through 15 generate ideal reference phase signal $S_{REF}$ and quadrature signal $S_{QR}$, a capacitance C, a resistance R, and the oscillation frequency $f_c$ of the local oscillator 101 should be selected so as to satisfy the following equation (1):

$$f_c = 1/2\pi RC \quad (1)$$

As evident from the above equation (1), as $f_c$ becomes higher, R and/or C becomes lower, making the circuit elements more susceptible to their structural variations and/or thermal deviations. As a result, a difference in amplitude and/or phase occurs between the reference phase signal $S_{REF}$ and the quadrature signal $S_{QR}$.

Especially, in a semiconductor integrated circuit, when a difference between a contact resistance between wiring layers and a resistance on the circuit becomes smaller, variations of the resistance becomes larger. Also, when the capacitance on the circuit becomes smaller, stray capacitance on a circuit board or wiring becomes non negligible, thereby making it more difficult to achieve a highly-accurate 90-degree divider.

SUMMARY OF THE INVENTION

Therefore, an object of the present invention is to provide a signal generator capable of generating a reference phase signal and a quadrature signal that are high in frequency and accuracy.

To attain the object mentioned above, one aspect of the present invention is directed to a signal generating circuit including a 90-degree divider for generating, from a first input signal having a predetermined frequency, an intermediate reference phase signal and an intermediate quadrature signal that is orthogonal in phase to the intermediate reference phase signal; a first mixer for generating a reference phase signal by mixing a second input signal having a predetermined frequency and the intermediate reference phase signal generated by the 90-degree divider; and a second mixer for generating a quadrature signal by mixing a third input signal having a predetermined frequency and the intermediate quadrature signal generated by the 90-degree divider.

According to the above aspect, the first and second mixers up-convert the frequencies of the intermediate reference phase signal $IS_{REF}$ and the intermediate quadrature signal $IS_{QR}$, respectively. Therefore, the 90-degree divider placed in a stage preceding these mixers can process a signal of a lower frequency, compared with the background art. Therefore, the circuit elements of the 90-degree divider become less susceptible to their structural variations and/or thermal deviations. Furthermore, stray capacitance on a circuit board or wiring can be suppressed to a negligible degree. Thus, it is possible to achieve a signal generator capable of generating highly-accurate, high-frequency reference phase signal and quadrature signal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a block diagram illustrating the circuit structure of a signal generating circuit $SG_4$ according to a fourth embodiment of the present invention;

DESCRIPTION OF THE PREFERRED EMBODIMENTS

Figure 1:
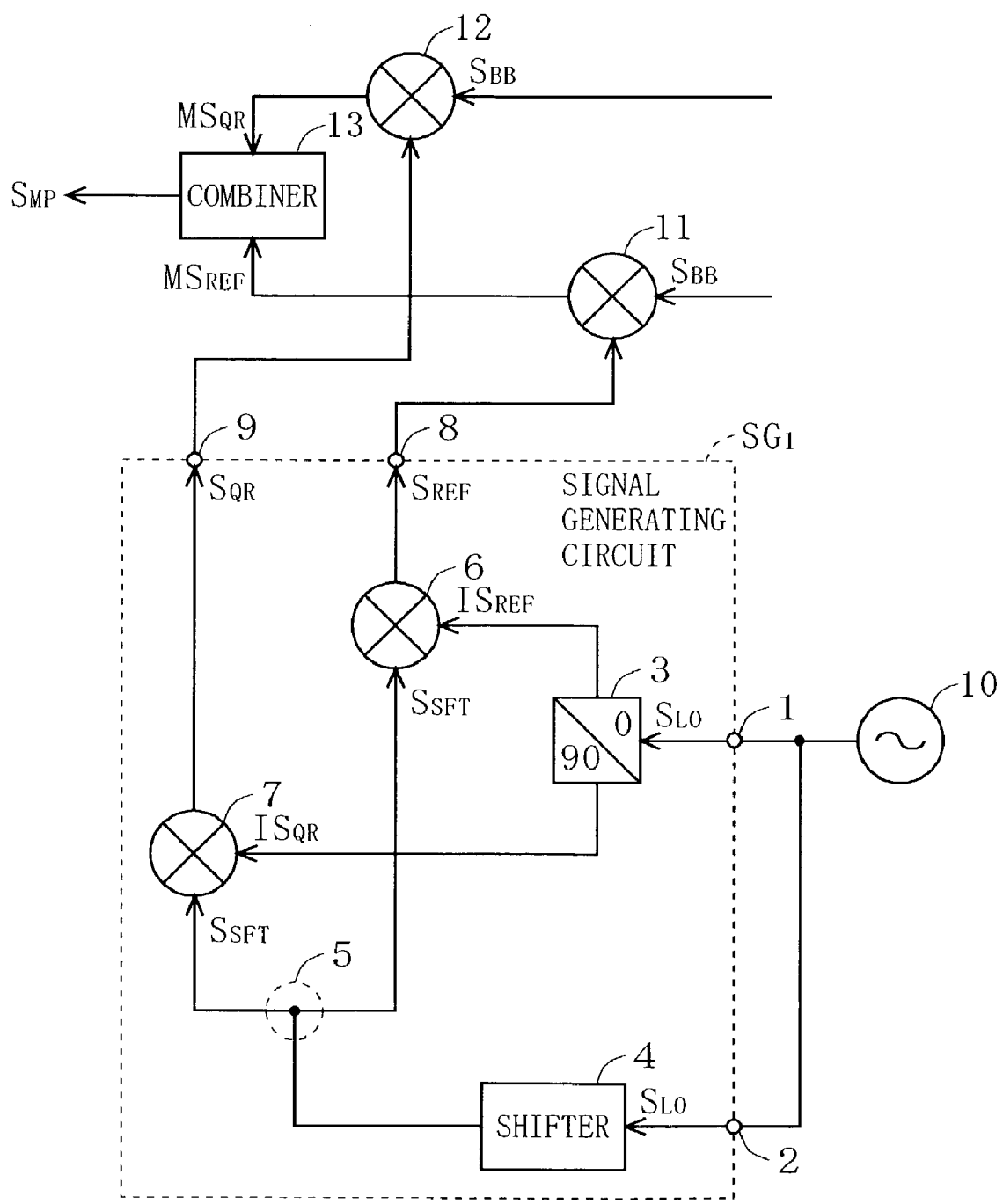
FIG. 1 is a block diagram illustrating the circuit configuration of a quadrature modulator incorporating a signal generating circuit $SG_1$ according to a first embodiment of the present embodiment.

FIG. 1 is a block diagram illustrating the circuit configuration of a quadrature modulator incorporating a signal generating circuit $SG_1$ according to a first embodiment of the present embodiment. In FIG. 1, the quadrature modulator includes the signal generating circuit $SG_1$. The signal generating circuit $SG_1$ includes two input terminal 1 and 2, a 90-degree divider 3, a shifter 4, a divider 5, two mixers 6 and 7, and two output terminals 8 and 9. With this configuration, highly-accurate reference phase signal $S_{REF}$ and quadrature signal $S_{QR}$ are generated. In view of clarification of differences from the background art, assume herein that the reference phase signal $S_{REF}$ and quadrature signal $S_{QR}$ have a frequency $f_{c1}$. Note that, as with background art, the quadrature signal $S_{QR}$ is orthogonal in phase to the reference phase signal $S_{REF}$. In addition to the above-mentioned signal generating circuit $SG_1$, the quadrature modulator further includes a local oscillator 10, two mixers 11 and 12 for quadrature modulation, and a combiner 13.

Descriptions are now made to the operation of the quadrature modulator, mainly the signal generating circuit $SG_1$. The input terminals 1 and 2 are coupled to the local oscillator 10. Here, the local oscillator 10 generates a local oscillation signal $S_{LO}$ having a frequency of $f_c$. In the present embodiment, the oscillation frequency $f_c$ may be $f_{c1}/2$, which is half that of the background art. Such local oscillation signal $S_{LO}$ is given to the input terminals 1 and 2.

Figure 13:
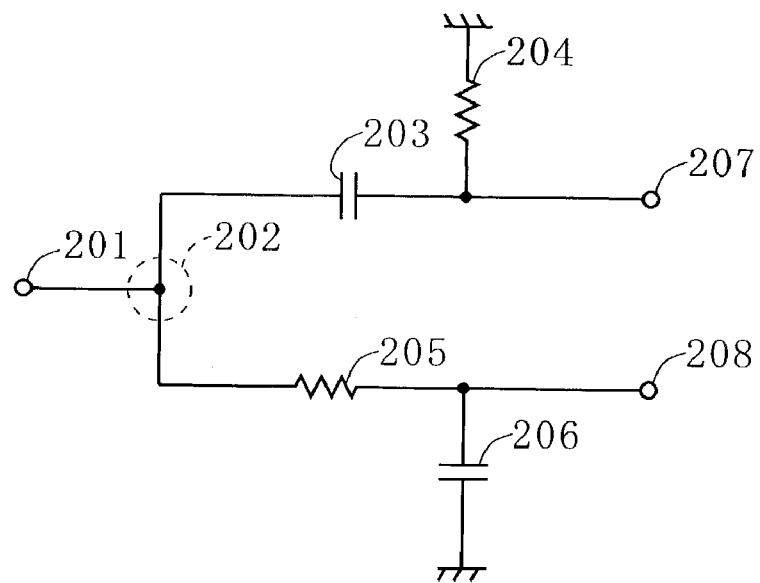
FIG. 13 is a schematic diagram illustrating the circuit configuration of an RC shifter, which is a first exemplary structure of a 90-degree divider 102 illustrated in FIG. 12.
Figure 14:
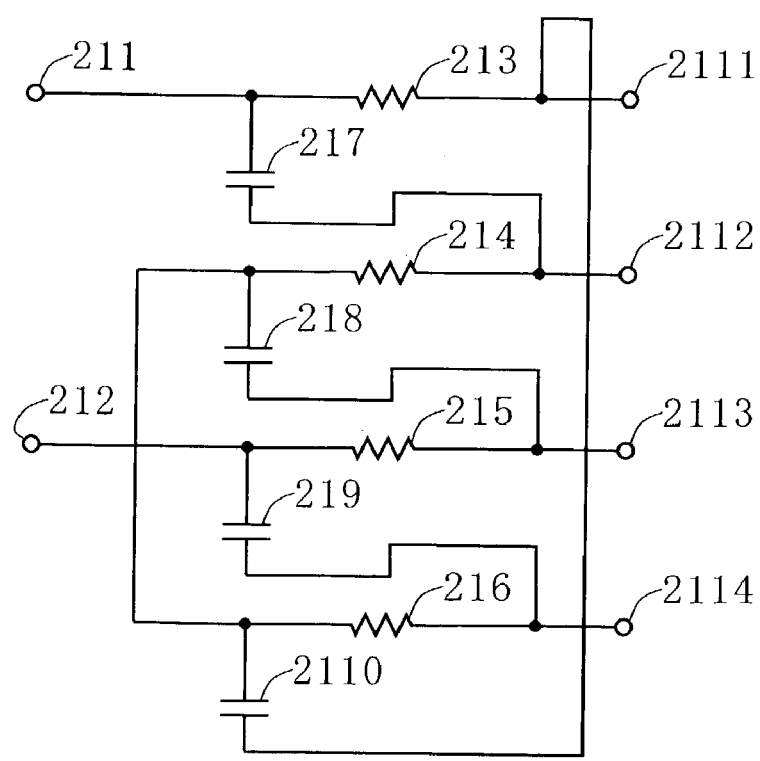
FIG. 14 is a schematic diagram illustrating the circuit configuration of a polyphase filter, which is a second exemplary structure of the 90-degree divider 102 illustrated in FIG. 12.
Figure 15:
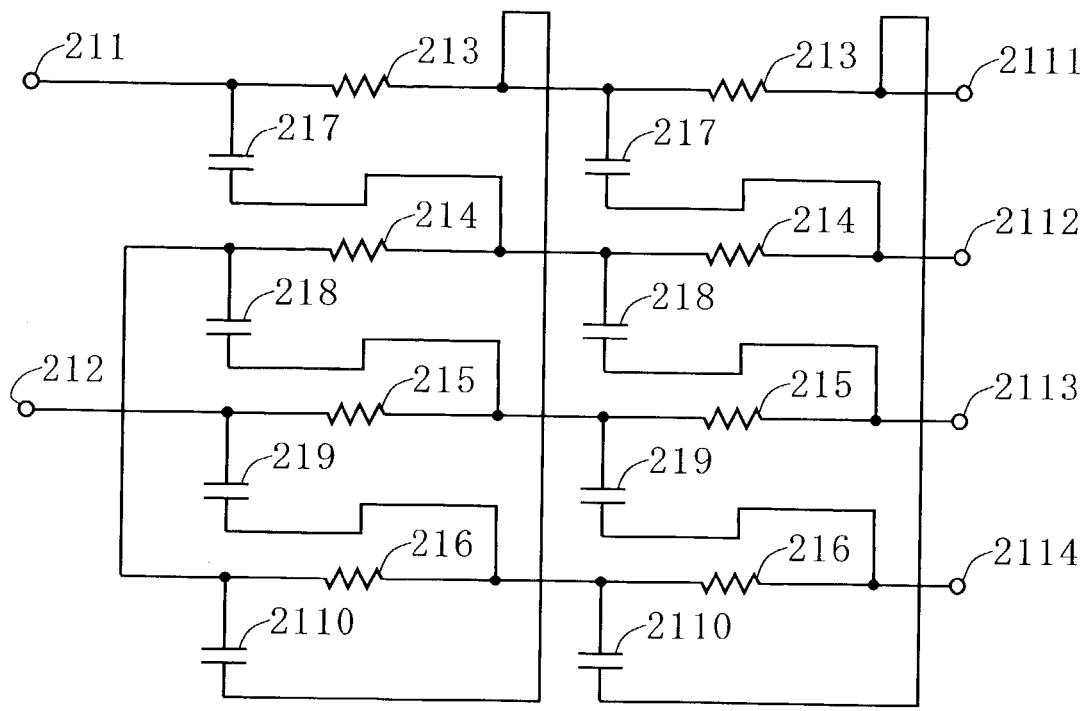
FIG. 15 is a schematic diagram illustrating the circuit configuration of a multistage polyphase filter, which is a third exemplary structure of the 90-degree divider 102 illustrated in FIG. 12.
Figure 16:
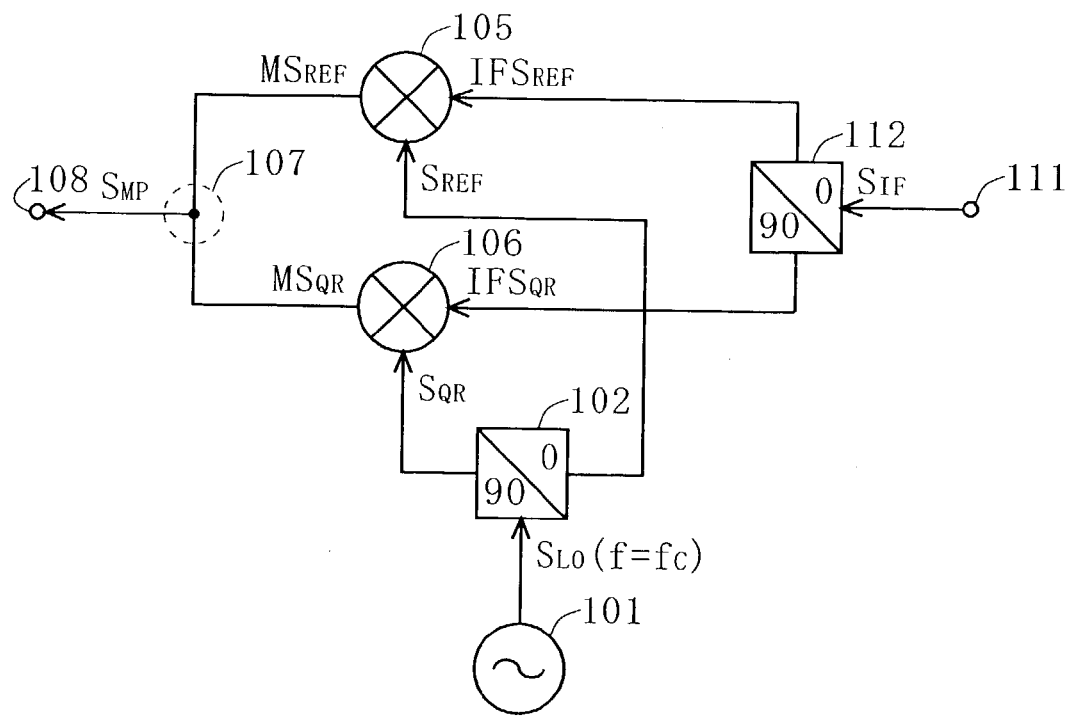
FIG. 16 is a block diagram illustrating the circuit configuration of a general image rejection mixer.

The 90-degree divider 3 has a circuit structure similar to that of the 90-degree divider 102 (refer to FIGS. 13–15). However, values of circuit elements constructing the 90-degree divider 3 (that is, resistance and/or capacitance) are larger than those constructing the 90-degree divider 102, which will be described further below. This 90-degree divider 3 is coupled to the input terminal 1 for generating an intermediate reference phase signal $IS_{REF}$ and an intermediate quadrature signal $IS_{QR}$ from the input local oscillation signal $S_{LO}$. These intermediate reference phase signal $IS_{REF}$ and intermediate quadrature signal $IS_{QR}$ have a frequency equal to the above oscillation frequency $f_{c1}/2$, and are orthogonal in phase to each other. The intermediate reference phase signal $IS_{REF}$ is supplied to the mixer 6, and the intermediate quadrature signal $IS_{QR}$ is supplied to the mixer 7.

The shifter 4 is implemented by a delay line or a delay filter, and is coupled to the input terminal 2. This shifter 4 shifts the phase of the input local oscillation signal $S_{LO}$ by a predetermined amount to generate a shifted signal $S_{SFT}$ for output to the divider 5. Note that the shifter 4 is a component preferable but not a component requisite for constructing the signal generating circuit $SG_1$. Depending on a relationship in phase among the local oscillation signal $S_{LO}$, the intermediate reference phase signal $IS_{REF}$, and the intermediate quadrature signal $IS_{QR}$, the signal generating circuit $SG_1$ can be constructed so that the local oscillation signal $S_{LO}$ given to the input terminal 2 is directly input to the divider 5. The divider 5 divides the input shift signal $S_{SFT}$ into two, one for output to the mixer 6 and the other for output to the mixer 7.

The mixer 6 mixes the input intermediate reference phase signal $IS_{REF}$ and the input shift signal $S_{SFT}$ to generate the above-mentioned reference phase signal $S_{REF}$ for output to the output terminal 8. The mixer 7 mixes the intermediate quadrature signal $IS_{QR}$ and the input shift signal $S_{SFT}$ to generate the above-mentioned quadrature signal $S_{QR}$ for output to the output terminal 8.

The output terminal 8 is coupled to the mixer 11 for quadrature modulation. The mixer 11 is supplied, via the output terminal 8, with the reference phase signal $S_{REF}$ output from the mixer 6. The mixer 11 is also supplied with a baseband signal $S_{BB}$ from another route. The mixer 11 mixes the input reference phase signal $S_{REF}$ and the input baseband signal $S_{BB}$ to generate a quadrature modulated signal $MS_{QR}$. These reference phase modulated signal $MS_{REF}$ and quadrature modulated signal $MS_{QR}$ are output to the combiner 13. The combiner 13 combines the input reference phase modulated signal $MS_{REF}$ and the input quadrature modulated signal $MS_{QR}$ to generate a composite signal $S_{MP}$.

Technical effects of the signal generating circuit $SG_1$ are described below in detail. Assume herein that the intermediate reference phase signal $IS_{REF}$ is $A \cdot exp(j\omega t)$ and the intermediate quadrature signal $IS_{QR}$ is $A \cdot exp(j\omega t + \pi/2)$. Furthermore, assume herein that the shift signal $S_{SFT}$ is $B \cdot exp(j\omega t + \theta)$. Here, A and B represent amplitude values of the respective signals. Also, θ is an angular frequency of the local oscillation signal $S_{LO}$, and is equal to $\pi \cdot f_{c1}$. Still further, θ represents an amount of phase shift in the shifter 4. With the signals represented as mentioned above, the reference phase signal $S_{REF}$ is represented as in the following equation (2), while the quadrature signal $S_{QR}$ as in the following equation (3):

$$A \cdot exp(j\omega t) \times B \cdot exp(j\omega t + \theta) = C \cdot exp(j2\omega t + \theta 0) \quad (2), \text{ and}$$

$$A \cdot exp(j\omega t + \pi/2) \times B \cdot exp(j\omega t + \theta) = C \cdot exp(j\omega t + \theta + \pi/2)) \quad (3),$$

where C is A×B.

As evident from the above equations (2) and (3), the reference phase signal $S_{RFF}$ and the quadrature signals $S_{QR}$ have a phase difference of 90 degrees. Furthermore, in the signal generating circuit $SG_1$, the mixers 6 and 7 up-convert the frequencies of the intermediate reference phase signal $IS_{REF}$ and the intermediate quadrature signal $IS_{QR}$, respectively. Therefore, the oscillation frequency of the local oscillator 10 can be $f_{c1}/2$, which is half the frequency $f_{c1}$ of the reference phase signal $S_{RFF}$ and the quadrature signal $S_{QR}$. In other words, the 90-degree divider 3 is supplied with the local oscillation signal $S_{LO}$ which is lower in frequency than background art. This means that $f_c$ in the equation (1) becomes decreased and that larger resistance and/or capacitance can be used in the 90-degree divider 3.

By way of example only, when the reference phase signal $S_{REF}$ and the quadrature signals $S_{QR}$ of a 5-GHz band are sought, the conventional 90-degree divider 102 requires a resistance of 64Ω and a capacitance of 0.5 pF, for example, in order to satisfy 5 GHz=½πRC. By contrast, for the purpose of constructing the signal generating circuit $SG_1$, the 90-degree divider 3 can use a resistance of 64Ω and a capacitance of 1 pF, for example, in order to satisfy 2.5 GHz=½πRC.

As such, by increasing the resistance value and/or the capacitance value, the circuit elements of the 90-degree divider 3 become less susceptible to their structural variations and/or thermal deviations. This causes less of a difference in amplitude and/or phase to occur between the reference phase signal $S_{REF}$ and the quadrature signal $S_{QR}$. Thus, it is possible to provide the signal generating circuit $SG_1$ capable of generating highly-accurate reference phase signal $S_{REF}$ and quadrature signal $S_{QR}$. Furthermore, since the resistance and capacitance of the 90-degree divider 3 can be increased, it is possible to provide the signal generating circuit $SG_1$ that is suitable for integration of a semiconductor circuit.

Other than the technical effects as mentioned above, since the oscillation frequency $f_c$ of the local oscillator 10 can be lowered compared with background art, a technical effect can be obtained such that the signal generating circuit $SG_1$ can be manufactured at low cost.

Still further, in the signal generating circuit $SG_1$, the 90-degree divider 3 for attenuating the amplitude of the local oscillation signal $S_{LO}$ is placed at a stage prior to the mixers 6 and 7. With this, a saturation level of each of the reference phase signal $S_{REF}$ and the quadrature signal $S_{QR}$ can be improved compared with the background art.

Still further, in the present embodiment, the local oscillator 10 is preferably coupled to both the input terminals 1 and 2, thereby enabling the signal generating circuit $SG_1$ to generate the reference phase signal $S_{REF}$ and the quadrature signal $S_{QR}$ that have a frequency which is double the oscillation frequency $f_c$. This is not meant to be restrictive. For example, first and second local oscillators different in oscillation frequency can be coupled to the input terminals 1 and 2, respectively, for the purpose of enabling the signal generating circuit $SG_1$ to support frequencies other than the doubled frequency. For achieving this purpose, it is also possible to frequency-convert either of the input local oscillation signal $S_{LO}$ supplied to the 90-degree divider 3; the input local oscillation signal $S_{LO}$ supplied to the shifter 4; both of the intermediate reference phase signal $IS_{REF}$ and the intermediate quadrature signal $IS_{QR}$; and the shift signal $S_{SFT}$.

Figure 2:
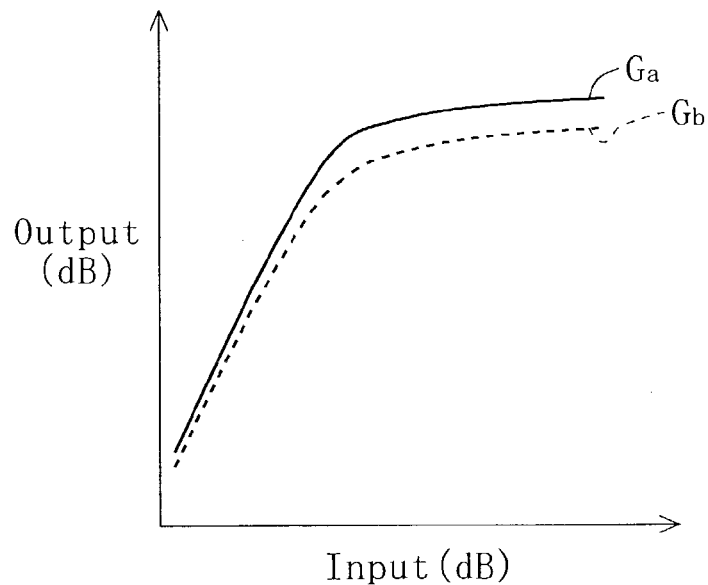
FIG. 2 is a graph illustrating a possible difference between input-output characteristics of a mixer 6 and input-output characteristics of a mixer 7 when a shifter 4 of FIG. 1 is not provided.

Still further, in the present embodiment, the signal generating circuit $SG_1$ preferably includes the shifter 4. Technical effects achieved by including the shifter 4 are described below in detail. For the purpose of clarifying the technical effects, a case where the local oscillation signal $S_{LO}$ is directly supplied to the signal generating circuit $SG_1$ without the shifter 4 is first described below. In the following descriptions, delay occurring in wiring of the signal generating circuit $SG_1$ is not considered. In this case, the mixer 6 is supplied with the intermediate reference phase signal $IS_{REF}$ and the local oscillation signal $S_{LO}$, while the mixer 7 is supplied with the intermediate quadrature signal $IS_{QR}$ and the local oscillation signal $S_{LO}$. However, since the intermediate quadrature signal $IS_{QR}$ and the local oscillation signal $S_{LO}$ have a phase difference of substantially 90 degree, input levels at the mixers 6 and 7 are differed on a time axis. Consequently, as illustrated in FIG. 2, the mixers 6 and 7 become asymmetrical in operation, causing a difference between conversion gains $G_a$ and $G_b$ of the mixers 6 and 7, respectively. Such a difference in conversion gains causes a large difference in amplitude between the reference phase signal $S_{REF}$ from the mixer 6 and the quadrature signal $S_{QR}$ from the mixer 7.

A case where the shifter 4 is provided to the signal generating circuit $SG_1$ is described below, assuming that the shifter 4 generates the shift signal $S_{SFT}$ by shifting the phase of the input local oscillation signal $S_{LO}$ by $\theta=45$ degrees. In this case, the mixer 6 is supplied with the intermediate reference phase signal $IS_{REF}$ and the shift signal $S_{SFT}$ having a phase difference therebetween of substantially 45 degrees, while the mixer 7 is supplied with the intermediate quadrature signal $IS_{QR}$ and the shift signal $I_{SFT}$ having a phase difference therebetween of substantially 45 degrees. As such, two signals different in phase by 45 degrees are supplied to each of the mixers 6 and 7, making their operations symmetrical to each other. Thus, it is possible to greatly reduce a difference in amplitude between the reference phase signal $S_{REF}$ output from the mixer 6 and the quadrature signal $S_{QR}$ output from the mixer 7.

In the foregoing descriptions, assume that the intermediate reference phase signal $IS_{REF}$ is $A \cdot \exp(j\omega t)$ and the intermediate quadrature signal $IS_{QR}$ is $A \cdot \exp(j\omega t + \pi/2)$. That is, the phase of the intermediate reference phase signal $IS_{REF}$ is 0 degrees, and the phase of the intermediate quadrature signal $IS_{QR}$ is 90 degrees. This is not meant to be restrictive, and the above-described technical effects can be obtained with a phase relationship other than the above. More specifically, the 90-degree divider 3 may generate the intermediate reference phase signal $IS_{REF}$ and the intermediate quadrature signal $IS_{QR}$ having a phase relationship other than the above as long as two signals supplied to the mixer 6 are different in phase by substantially 45 degrees or 135 degrees and two signals supplied to the mixer 7 are different in phase also by substantially 45 degrees or 135 degrees. By way of example only, a case is described below, wherein the 90-degree divider 3 generates two signals from the input local oscillation signal $S_{LO}$, one being the intermediate reference phase signal $IS_{REF}$ having a phase of +45 degrees and the other being the intermediate quadrature signal $IS_{QR}$ having a phase of −45 degrees. In this case, the operations of the mixers 6 and 7 become asymmetrical if there is a difference in length between a route from the input terminal 2 to the mixers 6 and 7 and a route from the input terminal it the mixers 6 and 7. However, according to the above-described signal generating circuit $SG_1$, the shifter 4 makes it possible to compensate for a phase difference occurring due to the above route difference. As a result, it is possible to greatly reduce a difference in amplitude between the reference phase signal $S_{REF}$ output from the mixer 6 and the quadrature signal $S_{QR}$ output from the mixer 7.

Figure 3:
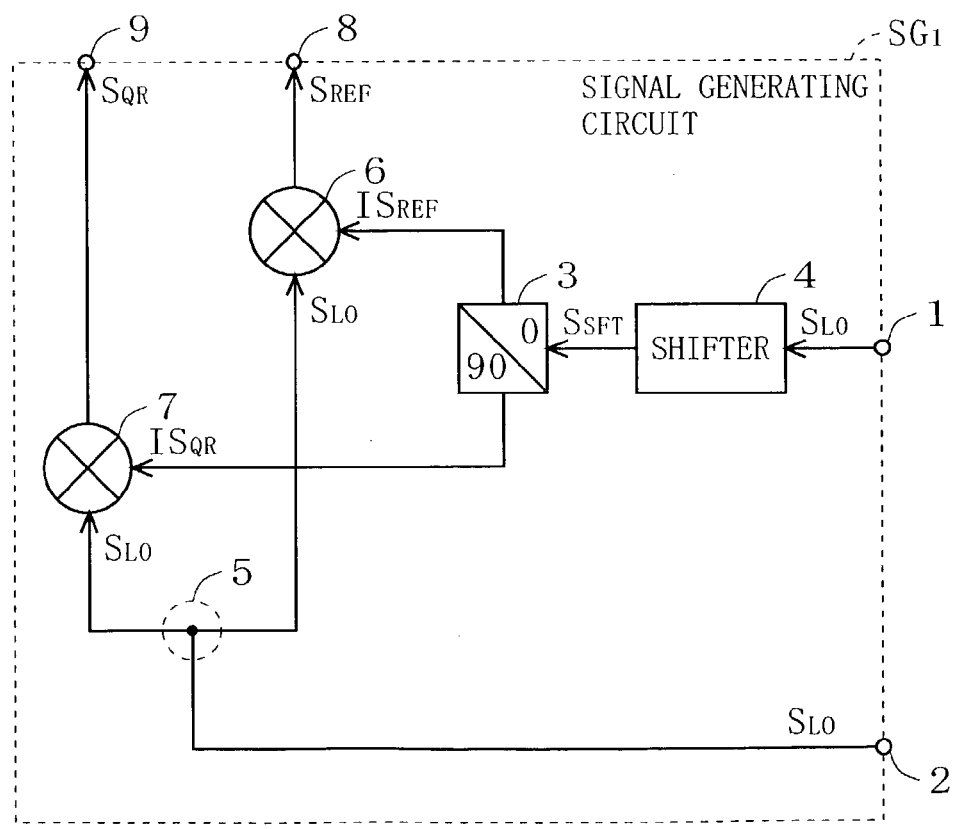
FIG. 3 is a block diagram illustrating an exemplary modification of the signal generating circuit $SG_1$ of FIG. 1.

Still further, in the present embodiment, the shifter 4 is placed between the input terminal 2 and the divider 5. This is not meant to be restrictive. As illustrated in FIG. 3, the shifter 4 can be placed between the input terminal 1 and the 90-degree divider 3 to shift the phase of the local oscillation signal $S_{LO}$ supplied through the input terminal 1 by 45 degrees. Also in this case, as with the above, the mixers 6 and 7 are each supplied with two signals differed in phase by 45 degrees from each other. Alternatively, the shifter 4 can be placed between the 90-degree divider 3 and the mixer 6 and/or the mixer 7, thereby giving two signals differed in phase by 45 degrees to each of the mixers 6 and 7.

Figure 4:
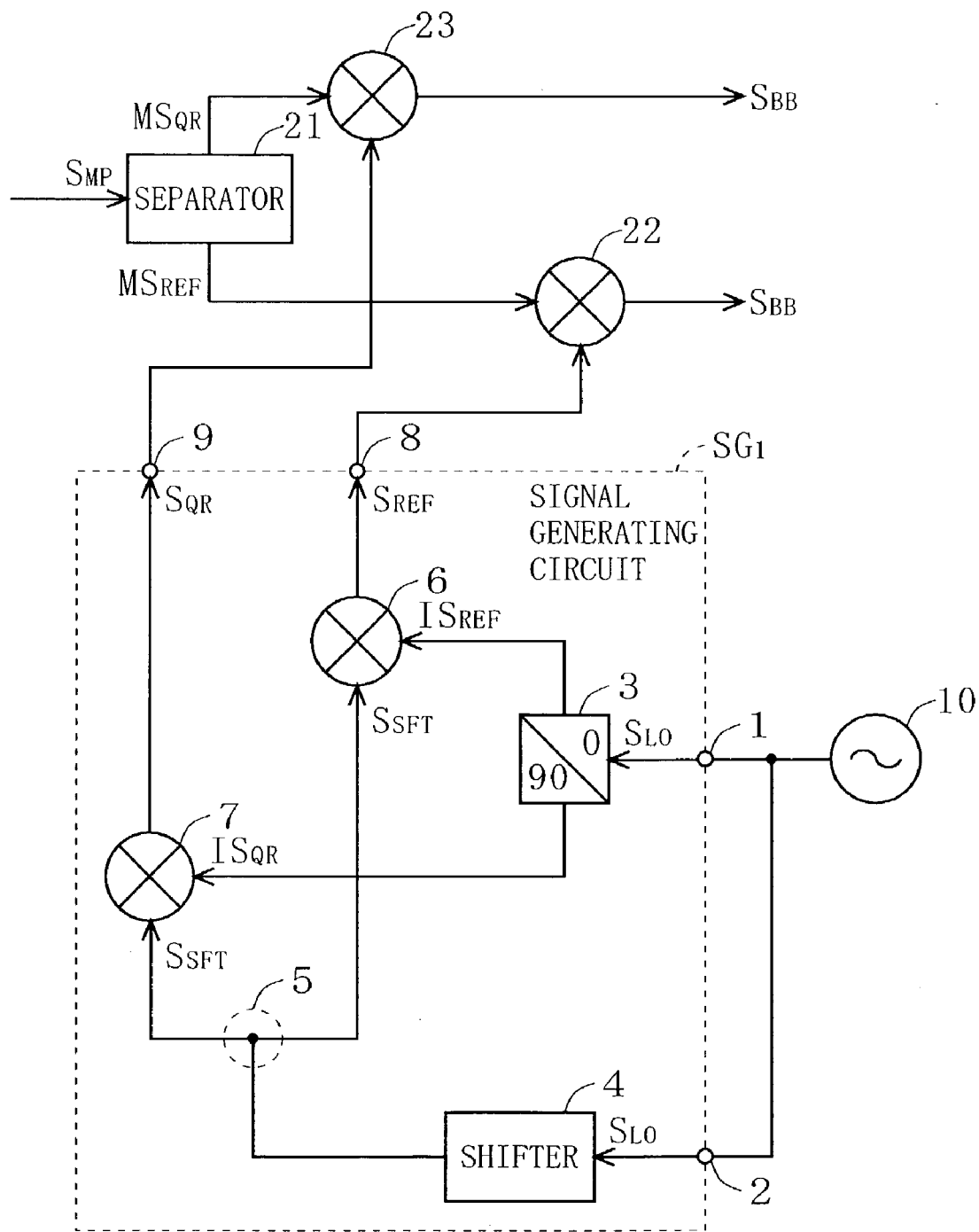
FIG. 4 is a block diagram illustrating the circuit configuration of a quadrature demodulator incorporating the signal generating circuit $SG_1$ of FIG. 1.

FIG. 4 is a block diagram illustrating the circuit configuration of a quadrature demodulator incorporating the signal generating circuit $SG_1$ of FIG. 1. The quadrature demodulator of FIG. 4 is different from the quadrature modulator of FIG. 1 only in that the mixers 11 and 12 and the combiner 13 are replaced by a separator 21 and mixers 22 and 23 for quadrature demodulation. Therefore, components equivalent to those of FIG. 1 are provided with the same reference numerals, and are not described herein.

The operation of the above-structured quadrature demodulator is described below. In FIG. 4, the separator 21 is supplied with the above-described composite signal $S_{MP}$. The separator 21 separates the input composite signal $S_{MP}$ into the phase reference modulated signal $MS_{REF}$ and the quadrature modulated signal $MS_{QR}$ for output to the mixer 22 and the mixer 23, respectively.

The mixer 22 is supplied with the reference phase modulated signal $MS_{REF}$ as well as the reference phase signal $S_{REF}$ generated by the signal generating circuit $SG_1$. The mixer 22 mixes the input reference phase modulated signal $MS_{REF}$ and the reference phase signal $S_{REF}$ to reproduce the baseband signal $S_{BB}$. The mixer 23 is supplied with the quadrature modulate signal $MS_{QR}$ as well as the quadrature signal $S_{QR}$ generated by the signal generating circuit $SG_1$. The mixer 22 mixes the input the quadrature modulate signal $MS_{QR}$ and the quadrature signal $S_{QR}$ to reproduce the baseband signal $S_{BB}$.

Figure 5:
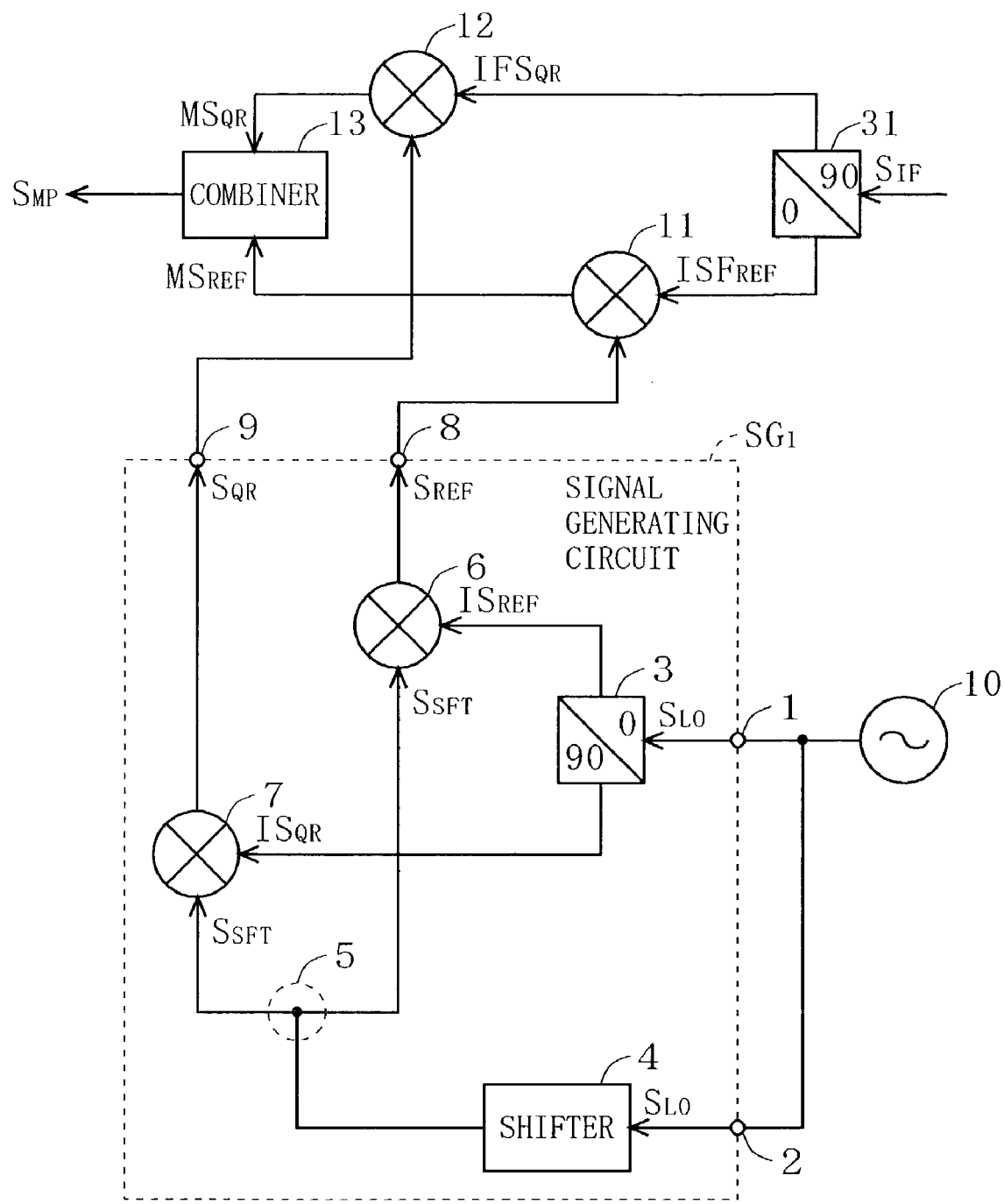
FIG. 5 is a block diagram illustrating an image rejection mixer incorporating the signal generating circuit $SG_1$ of FIG. 1.

Also, FIG. 5 is a block diagram illustrating an image rejection mixer incorporating the signal generating circuit $SG_1$ of FIG. 1. The image rejection mixer of FIG. 5 is different from the quadrature modulator of FIG. 1 only in that a 90-degree divider 31 is further provided. Therefore, in FIG. 5, components equivalent to those of FIG. 1 are provided with the same reference numerals.

The operation of the above-structured image rejection mixer is described below. The 90-degree divider 31 is supplied with an intermediate frequency (IF) signal $S_{IF}$. Here, the IF signal $S_{IF}$ is a signal obtained by modulating a carrier having an intermediate frequency with a baseband signal. From this input IF signal $S_{IF}$, the 90-degree divider 31 generates the reference phase IF signal $IFS_{REF}$ and the quadrature IF signal $IFS_{QR}$. Here, the reference phase IF signal $IFS_{REF}$ and the quadrature IF signal $IFS_{QR}$ are different in phase from each other by 90 degrees, and are equal in amplitude to each other. The reference phase IF signal $IFS_{REF}$ is output to the mixer 11, and the quadrature IF signal $IFS_{QR}$ is output to the mixer 12.

The mixer 11 mixes the input reference phase IF signal $IFS_{REF}$ and the input reference phase signal $S_{RF}$ to generate a reference phase modulated signal $MS_{REF}$. The mixer 22 mixes the input quadrature IF signal $IFS_{QR}$ and the input quadrature signal $S_{QR}$ to generate a quadrature modulated signal $MS_{QR}$. The generated reference phase modulated signal $MS_{REF}$ and quadrature modulated signal $MS_{QR}$ are both output to the combiner 13, which combines these two signals to generate a composite signal $S_{MP}$.

Figure 6:
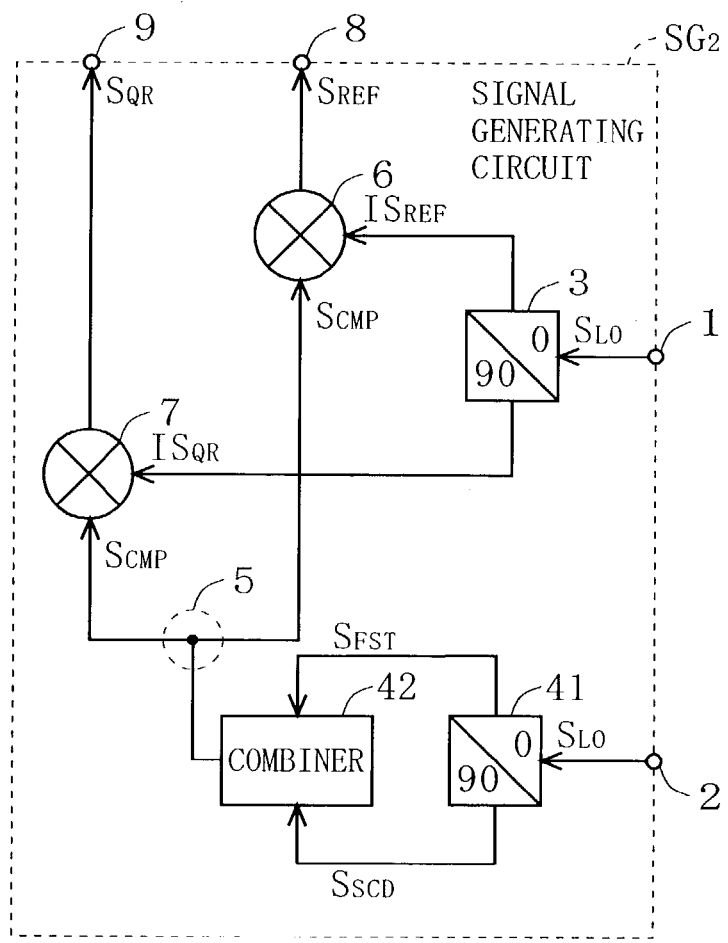
FIG. 6 is a block diagram illustrating the circuit configuration of a signal generating circuit $SG_2$ according to a second embodiment of the present invention.

FIG. 6 is a block diagram illustrating the circuit configuration of a signal generating circuit $SG_2$ according to a second embodiment of the present invention. The signal generating circuit $SG_2$ of FIG. 6 is different from the signal generating circuit $SG_1$ of FIG. 1 only in that the shifter 4 is replaced by a 90-degree divider 41 and a combiner 42. Therefore, in FIG. 6, components equivalent to those of FIG. 1 are provided with the same reference numerals, and are not described herein.

The input terminal 2 is coupled to the 90-degree divider 41. The 90-degree divider 41 has input/output characteristics equal to those of the 90-degree divider 3, and generates a first signal $S_{FST}$ and a second signal $S_{SCD}$ from the input local oscillation signal $S_{LO}$. The first signal $S_{SFT}$ is equal in phase and amplitude to the above-described intermediate reference phase signal $IS_{REF}$. The second signal $S_{SCD}$ is equal in phase and amplitude to the above-described intermediate quadrature signal $IS_{QR}$. These first and second signals $S_{FST}$ and $S_{SCD}$ are supplied to the combiner 42, which combines these two signals to generate a composite signal $S_{CMP}$ for output to the divider 5.

Figure 7:
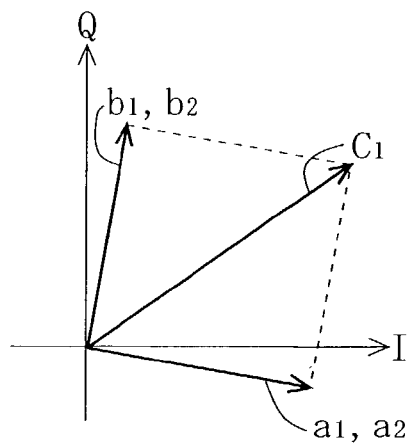
FIG. 7 is a vector diagram illustrating a phase relation among a composite signal $S_{CMP}$, an intermediate reference phase signal $IS_{REF}$, and an intermediate quadrature signal $IS_{QR}$ illustrated in FIG. 6.

FIG. 7 is a vector diagram illustrating a phase relation among the composite signal $S_{CMP}$, the intermediate reference phase signal $IS_{REF}$, and the intermediate quadrature signal $IS_{QR}$. In FIG. 7, a vector $a_1$ represents the intermediate reference phase signal $IS_{REF}$. A vector $a_2$ represents the first signal $S_{FST}$, being equal in magnitude and direction to the vector $a_1$. A vector $b_1$ represents the intermediate quadrature signal $IS_{QR}$, being equal in magnitude to the vector $a_1$ but different in direction therefrom by 90 degrees. A vector $b_2$ represents the second signal $S_{SCD}$, being equal in magnitude and direction to the vector $b_1$. As described above, the composite signal $S_{CMP}$ is obtained by combining the first and second signals $S_{SFT}$ and $S_{SCD}$, and can therefore be represented by a vector c by combining the vectors $a_2$ and $b_2$. This vector c is different in direction from the vectors $a_2$ and $b_2$ by 45 degrees.

As evident from the above, the composite signal $S_{CMP}$ is equal to the shift signal $S_{SFT}$ in the first embodiment. Therefore, the signal generating circuit $SG_2$ can also achieve technical effects similar to those achieved by the signal generating circuit $SG_1$. Furthermore, the 90-degree divider 41 can be implemented with a simple structure as illustrated in FIG. 13, and can therefore be smaller in size than the shifter 4 which is implemented by a delay line or a delay filter. With this, it is possible to provide the signal generating circuit $SG_2$ that is more suitable for integration of a semiconductor circuit.

If the shifter 4 is implemented by a delay line in the first embodiment, the amount of phase rotation performed by the shifter 4 is varied in accordance with the frequency $f_c$ of the local oscillation signal $S_{LO}$. For example, assume that the signal generating circuit $SG_1$ according to the first embodiment is designed so that the amount of phase rotation that can be obtained by the shifter 4 is 45 degrees when the oscillation frequency $f_c$ is 1.25 GHz. When the oscillation frequency $f_c$ is changed to 1.5 GHz, the above-designed signal generating circuit $SG_1$ cannot obtain the amount of phase rotation of 45 degrees. By contrast, in the signal generating circuit $SG_2$ illustrated in FIG. 6, the first and second signals $S_{FST}$ and $S_{SCD}$ are combined to generate the composite signal $S_{CMP}$. Therefore, irrespectively of the frequency $f_c$ of the local oscillation signal $S_{LO}$, the composite signal $S_{CMP}$ can keep a phase relationship of 45 degrees with both of the intermediate reference phase signal $IS_{REF}$ and the intermediate quadrature signal $IS_{QR}$ over a wide frequency band. Thus, the signal generating circuit $SG_2$ can generate the reference phase signal $S_{REF}$ and the quadrature signal $S_{QR}$ that are orthogonal to each other more accurately than signal generating circuit $SG_1$ according to the first embodiment.

Figure 8:
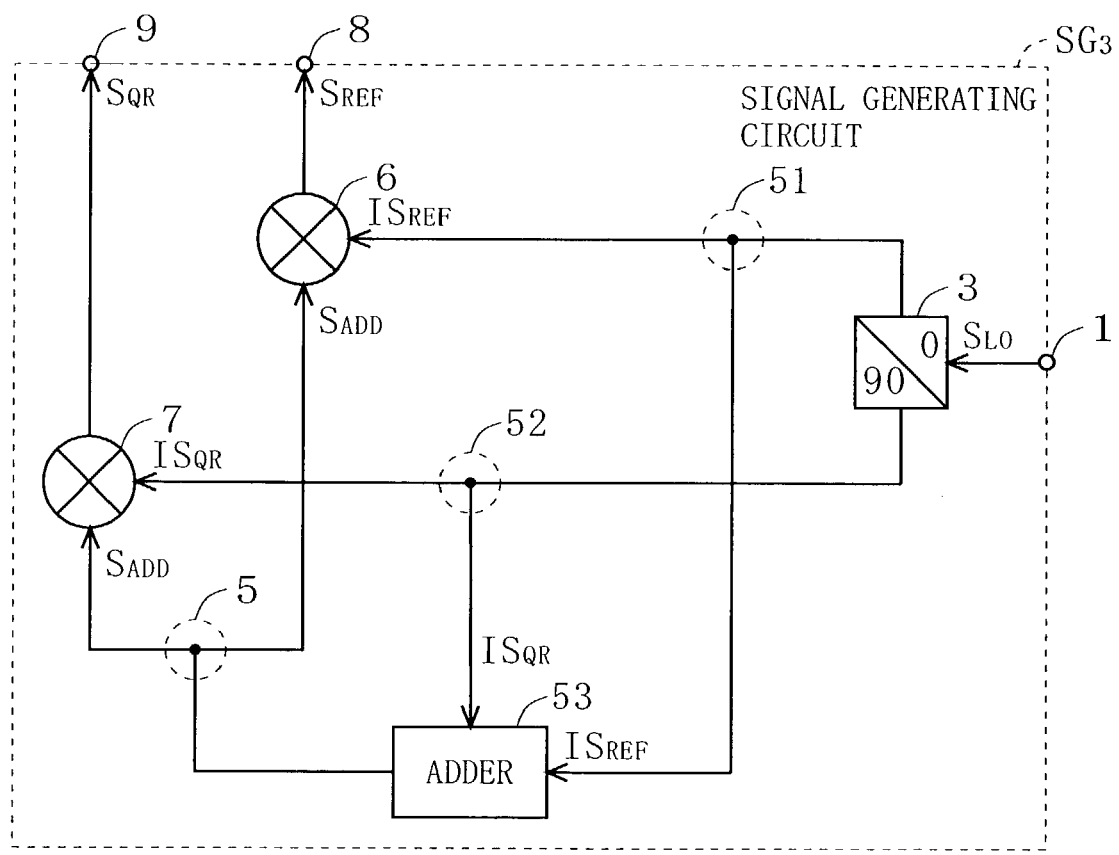
FIG. 8 is a block diagram illustrating the circuit structure of a signal generating circuit $SG_3$ according to a third embodiment of the present invention.

FIG. 8 is a block diagram illustrating the circuit structure of a signal generating circuit $SG_3$ according to a third embodiment of the present invention. The signal generating circuit $SG_3$ of FIG. 8 is different from the signal generating circuit $SG_1$ of FIG. 1 only in that the input terminal 2 and the shifter 4 are replaced by dividers 51 and 52, and an adder 53. Therefore, in FIG. 8, components equivalent in structure to those in FIG. 1 are provided with the same reference numerals, and are not described herein.

The divider 51 is placed between the 90-degree divider 3 and the mixer 6 for dividing the intermediate reference phase signal $IS_{REF}$ supplied by the 90-degree divider 3 into two, one for output to the mixer 6 and the other for output to the adder 53. The divider 52 is placed between the 90-degree divider 3 and the mixer 7 for dividing the intermediate quadrature signal $IS_{QR}$ supplied by the 90-degree divider 3 into two, one for output to the mixer 7 and the other for output to the adder 53. The adder 53 adds the intermediate reference phase signal $IS_{REF}$ and the intermediate quadrature signal $IS_{QR}$ together to generate an addition signal $S_{ADD}$ for output to the divider 5.

The addition signal $S_{ADD}$ is obtained by adding the intermediate reference phase signal $IS_{REF}$ and the intermediate quadrature signal $IS_{QR}$. Therefore, as with the composite signal $S_{CMP}$, the addition signal $S_{ADD}$ is a signal equal to the shift signal $S_{SFT}$. For this reasons, the signal generating circuit $SG_3$ can also achieve technical effects similar to those achieved by the signal generating circuit $SG_1$. Furthermore, the adder 53 can be implemented with a simple structure, and can therefore be smaller in size than the shifter 4 which is implemented by a delay line or a delay filter. With this, it is possible to provide the signal generating circuit $SG_3$ that is more suitable for integration of a semiconductor circuit.

Still further, the adder 53 generates the composite signal $S_{CMP}$ from the intermediate reference phase signal $IS_{REF}$ and the intermediate quadrature signal $IS_{QR}$ supplied from the mixers 6 and 7, respectively. Therefore, the addition signal $S_{ADD}$ can keep a phase relationship of 45 degrees with both of the intermediate reference phase signal $IS_{REF}$ and the intermediate quadrature signal $IS_{QR}$ over a wide frequency band. Thus, as with the second embodiment, the signal generating circuit $SG_3$ can generate the reference phase signal $S_{REF}$ and the quadrature signal $S_{QR}$ that are orthogonal to each other more accurately than the signal generating circuit $SG_1$ according to the first embodiment.

FIG. 9 is a block diagram illustrating the circuit structure of a signal generating circuit $SG_4$ according to a fourth embodiment of the present invention. The signal generating circuit $SG_4$ of FIG. 9 is different from the signal generating circuit $SG_1$ of FIG. 1 only in that the input terminal 2 and the shifter 4 are replaced by dividers 61 and 62, amplifiers 63–66 having the same input/output characteristics and delay characteristics each other, and a combiner 67. Therefore, in FIG. 9, components equivalent in structure to those in FIG. 1 are provided with the same reference numerals, and are not described herein.

The divider 61 divides the intermediate reference phase signal $IS_{REF}$ supplied by the 90-degree divider 3 into two, one for output to the amplifier 63 and the other for output to the amplifier 64. The amplifier 63 amplifies the input intermediate reference phase signal $IS_{REF}$ for output to the mixer 6. The amplifier 64 amplifies the input intermediate reference phase signal $IS_{REF}$ for output to the combiner 67.

The divider 62 divides the intermediate quadrature signal $IS_{QR}$ supplied by the 90-degree divider 3 into two, one for output to the amplifier 65 and the other for output to the amplifier 66. The amplifier 65 amplifies the input intermediate quadrature signal $IS_{QR}$ for output to the mixer 7. The amplifier 66 amplifies the input intermediate quadrature signal $IS_{QR}$ for output to the combiner 67. The combiner 67 combines the input intermediate reference phase signal $IS_{REF}$ and the input intermediate quadrature signal $IS_{QR}$ to generate a composite signal $S_{CMP}$ for output to the divider 5.

Here, in the above descriptions, the amplifiers 63–66 each rotate the phase of the input signal $IS_{REF}$ or $IS_{QR}$ by the same amount, and also amplify the amplitude of the input signal $IS_{REF}$ or $IS_{QR}$ to the same value. Therefore, the composite signal $S_{CMP}$ is a signal equal to the shift signal $S_{SFT}$. Therefore, the signal generating circuit $SG_4$ can also achieve technical effects similar to those achieved by the signal generating circuit $SG_1$. Furthermore, the amplifiers 63 through 66 are sufficiently small in size. With the use of these amplifiers, it is possible to provide the signal generating circuit $SG_4$ that is suitable for a semiconductor integrated circuit.

Still further, the combiner 67 generates the composite signal $S_{CMP}$ from the intermediate reference phase signal $IS_{REF}$ and the intermediate quadrature signal $IS_{QR}$ supplied from the 90-degree divider 3. Therefore, the composite signal $S_{CMP}$ can keep a phase relationship of 45 degrees with both of the intermediate reference phase signal $IS_{REF}$ and the intermediate quadrature signal $IS_{QR}$ over a wide frequency band. Thus, as with the second embodiment, the signal generating circuit $SG_4$ can generate the reference phase signal $S_{REF}$ and the quadrature signal $S_{QR}$ more accurately than the signal generating circuit $SG_1$ according to the first embodiment.

Figure 10:
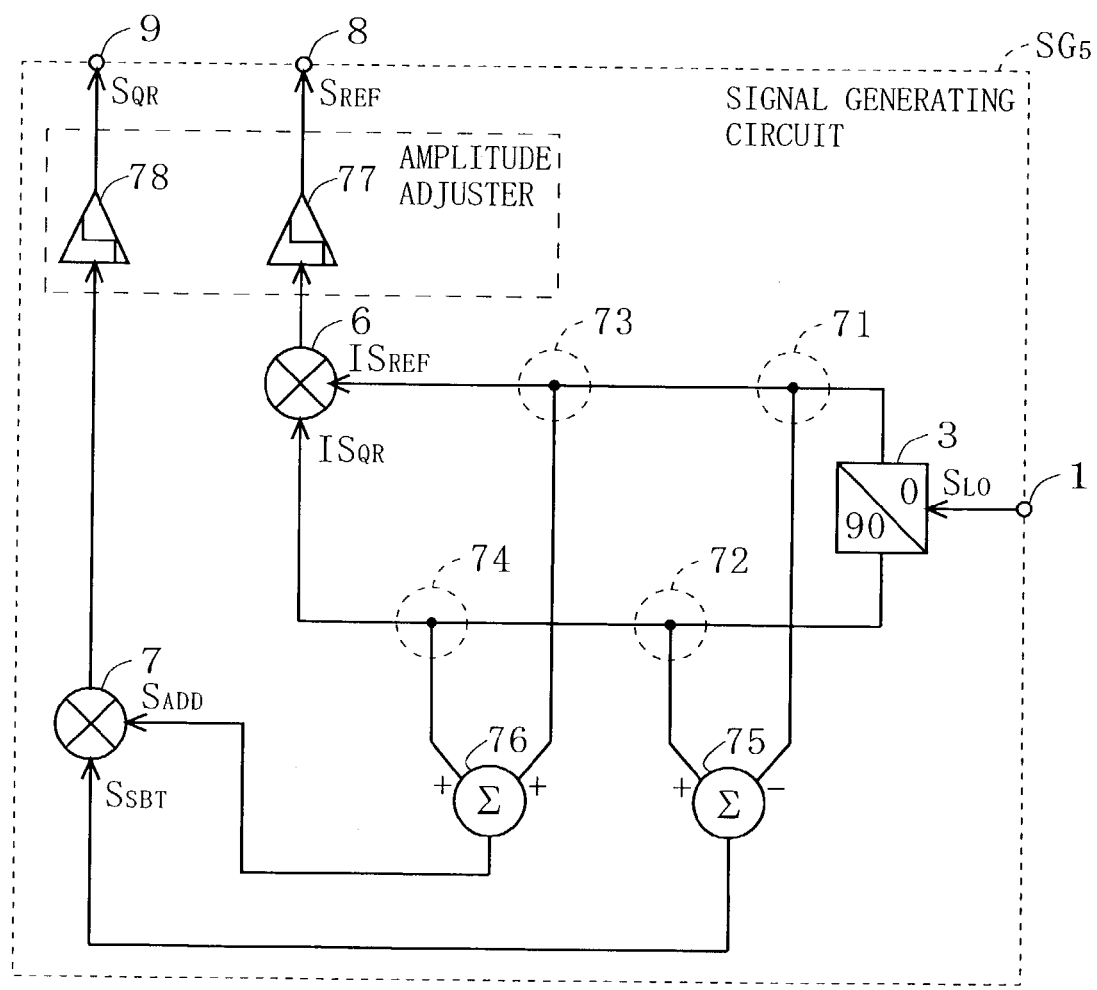
FIG. 10 is a block diagram illustrating the circuit configuration of a signal generating circuit $SG_5$ according to a fourth embodiment of the present invention.

FIG. 10 is a block diagram illustrating the circuit structure of a signal generating circuit $SG_5$ according to a fifth embodiment of the present invention. The signal generating circuit $SG_5$ of FIG. 10 includes the input terminal 1, the 90-degree divider 3, dividers 71 through 74, a subtractor 75, an adder 76, the two mixers 6 and 7, two limiter amplifiers 77 and 78, which are one example of an amplitude adjusting section in the claims, and the two output terminals 8 and 9. In FIG. 10, components equivalent in structure to those in FIG. 1 are provided with the same reference numerals, and are not described herein. The above-structured signal generating circuit $SG_5$ generates highly-accurate reference phase signal $S_{REF}$ and quadrature signal $S_{QR}$. Assume herein that, as with the first embodiment, the reference phase signal $S_{REF}$ and the quadrature signal $S_{QR}$ have a frequency of $f_{c1}$. Also, as with background art, the quadrature signal $S_{QR}$ is orthogonal in phase to the reference phase signal $S_{REF}$.

The operation of the signal generating circuit $SG_5$ is described below. As with FIG. 1, the input terminal 1 is coupled to the local oscillator 10 that outputs a local oscillation signal $S_{LO}$ having a frequency of $f_{c1}/2$. The 90-degree divider 3 generates the above-mentioned intermediate reference phase signal $IS_{REF}$ and intermediate quadrature signal $IS_{QR}$ from the local oscillation signal $S_{LO}$ supplied through the input terminal 1. The intermediate reference phase signal $IS_{REF}$ is output to the divider 71, while the intermediate quadrature signal $IS_{QR}$ is output to the divider 72.

The divider 71 divides the input intermediate reference phase signal $IS_{REF}$ into two, one for output to the divider 73 and the other for output to the subtractor 75. The divider 73 divides the intermediate reference phase signal $IS_{REF}$ supplied by the divider 71 into two, one for output to the mixer 6 and the other for output to the adder 76. The divider 72 divides the input intermediate quadrature signal $IS_{QR}$ into two, one for output to the divider 74 and the other for output to the subtractor 75. The divider 74 divides the intermediate quadrature signal $IS_{QR}$ supplied by the divider 72 into two, one for output to the mixer 6 and the other for output to the adder 76.

As evident from above, the mixer 6 is supplied with the intermediate reference phase signal $IS_{REF}$ and the intermediate quadrature signal $IS_{QR}$. The mixer 6 mixes the intermediate reference phase signal $IS_{REF}$ and the intermediate quadrature signal $IS_{QR}$ to generate a reference phase signal $S_{REF}$ having a frequency of $f_c$ for output to the limiter amplifier 77. The limiter amplifier 77 adjusts the amplitude of the input reference phase signal $S_{REF}$ to a predetermined value for output to the output terminal 8.

The subtractor 75 is also supplied with the intermediate reference phase signal $IS_{REF}$ and the intermediate quadrature signal $IS_{QR}$. The subtractor 75 subtracts the intermediate reference phase signal $IS_{REF}$ from the intermediate quadrature signal $IS_{QR}$ to generate a subtraction signal $S_{SBT}$ for output to the mixer 7. Furthermore, the adder 76 is supplied also with the intermediate reference phase signal $IS_{REF}$ and the intermediate quadrature signal $IS_{QR}$. The adder 76 adds the intermediate reference phase signal $IS_{REF}$ and the intermediate quadrature signal $IS_{QR}$ together to generate an addition signal $S_{ADD}$ for output to the mixer 7. The mixer 7 mixes the input subtraction signal $S_{SBT}$ and the addition signal $S_{ADD}$ to generate a quadrature signal $S_{QR}$ differed in phase by 90 degrees from the reference phase signal $S_{REF}$ generated by the mixer 6. This quadrature signal $S_{QR}$ is output to the limiter amplifier 78. The limiter amplifier 78 adjusts the quadrature signal $S_{QR}$ to a value equal to the value of the amplitude of the reference phase signal $S_{REF}$ output from the limiter amplifier 77, and then outputs the amplitude-adjusted quadrature signal $S_{QR}$ to the output terminal 9.

Figure 11:
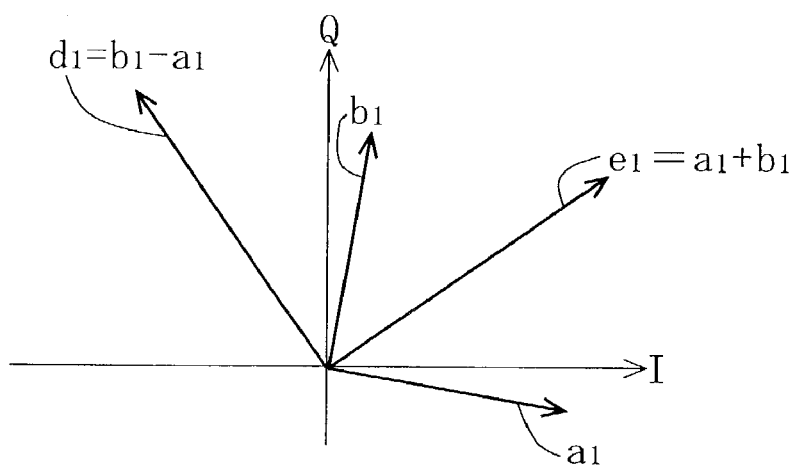
FIG. 11 is a vector diagram illustrating a phase relation among an intermediate reference phase signal $IS_{REF}$, the intermediate quadrature signal $IS_{QR}$ an subtraction signal $S_{SBT}$, and an addition signal $S_{ADD}$ illustrated in FIG. 10.
Figure 12:
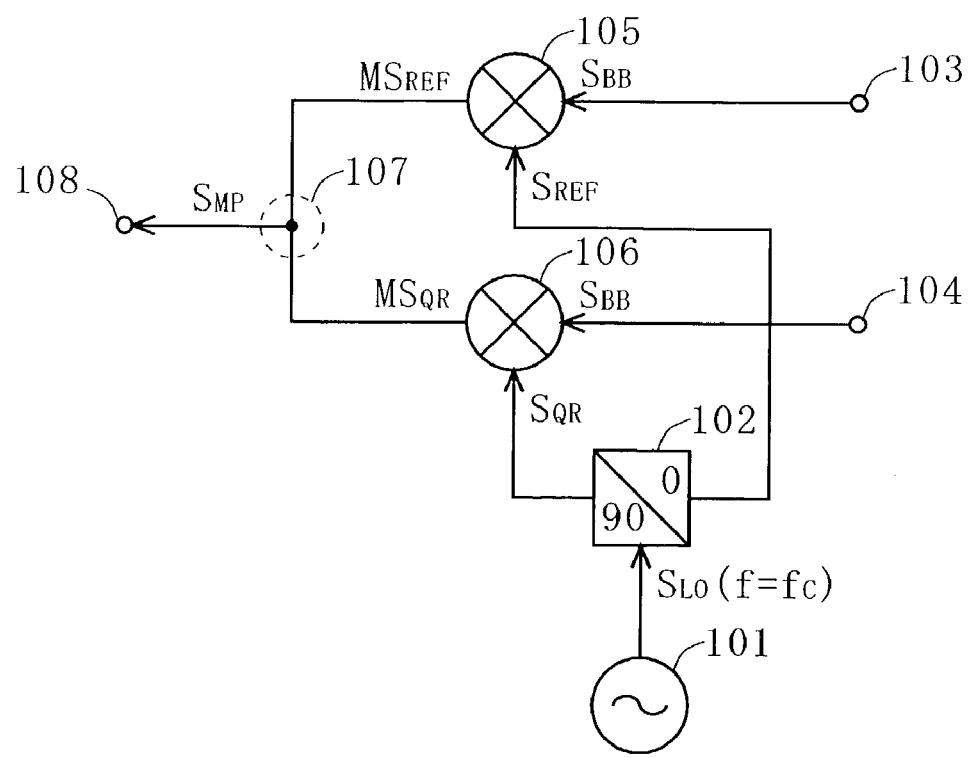
FIG. 12 is a block diagram illustrating the circuit configuration of a general quadrature modulator.

FIG. 11 is a vector diagram illustrating a phase relation among the intermediate reference phase signal $IS_{REF}$, the intermediate quadrature signal $IS_{QR}$, the subtraction signal $S_{SBT}$, and the addition signal $S_{ADD}$. In FIG. 11, vectors $a_1$ and $b_1$ represent the intermediate reference phase signal $IS_{REF}$ and the intermediate quadrature signal $IS_{QR}$, respectively. A vector $d_1$ represents the subtraction signal $S_{SBT}$, being equal to $(b_1-a_1)$. Therefore, the subtraction signal $S_{SBT}$ is different in phase by 135 degrees from the intermediate reference phase signal $IS_{REF}$, and by 45 degrees from the intermediate quadrature signal $IS_{QR}$. Furthermore, a vector $e_1$ represents the addition signal $S_{ADD}$, being equal to $(a_1+b_1)$. Therefore, the addition signal $S_{ADD}$ is different in phase by 45 degrees from both of the intermediate reference phase signal $IS_{REF}$ and the intermediate quadrature signal $IS_{QR}$.

Assume herein that, as with the above descriptions, the vector $a_1$ is $A \cdot \exp(j\omega t)$ and the vector $b_1$ is $A \cdot \exp(j\omega t + \pi/2)$. Furthermore, assume herein that the vector $d_1$ is $D \cdot \exp(j\omega t + 3\pi/4)$ and the vector $e_1$ is $D \cdot \exp(j\omega t + \pi/4)$, where D is an amplitude value of the subtraction signal $S_{SBT}$ and the addition signal $S_{ADD}$, and is $A \cdot \sqrt{2}$. The reference phase signal $S_{REF}$ is represented as the following equation (4), while the quadrature signal $S_{QR}$ is represented as the following equation (5):

$$A \cdot \exp(j\omega t) \times A \cdot \exp(j\omega t + \pi/2) = A^2 \cdot \exp(j\omega t + \pi/2) \quad (4)$$

and $$D \cdot \exp(j\omega t + 3\pi/4) \times D \cdot \exp(j\omega t + \pi/4) = D^2 \cdot \exp(j\omega t + \pi) \quad (5).$$

As evident from the above equations (4) and (5), the reference phase signal $S_{REF}$ and the quadrature signal $S_{QR}$ are different in phase by 90 degrees from each other. Furthermore, in the signal generating circuit $SG_5$, the limiter amplifiers 77 and 78 adjusts the amplitudes of the reference phase signal $S_{REF}$ and the quadrature signal $S_{QR}$ so as to satisfy $A^2 = D^2$. With this, the signal generating circuit $SG_5$ can also achieve technical effects similar to those achieved by the signal generating circuit $SG_1$.

Also, as evident from the above equations (4) and (5), irrespectively of the frequency $f_c$ (that is, angular frequency $\omega$) of the local oscillation signal $S_{LO}$, the reference phase signal $S_{REF}$ and the quadrature signal $S_{QR}$ can keep an orthogonal relationship with each other over a wide frequency band. Thus, the signal generating circuit $SG_5$ can also generate the reference phase signal $S_{REF}$ and the quadrature signal $S_{QR}$ more accurately than the signal generating circuit $SG_1$ according to the first embodiment.

Note that, in the fifth embodiment, the amplitudes of the reference phase signal $S_{REF}$ and the quadrature signal $S_{QR}$ are adjusted by the limiter amplifiers 77 and 78, respectively. This is not meant to be restrictive. The amplitude can be adjusted by any level adjuster typified by an attenuator. Also, in the fifth embodiment, the limiter amplifiers 77 and 78 are placed subsequent to the stages of the mixer 6 and 7, respectively. This circuit configuration is not meant to be restrictive. Alternatively, a single limiter amplifier can be placed subsequent to the stage of either one of the mixers 6 and 7 in order to eliminate an amplitude difference between the reference phase signal $S_{REF}$ and the quadrature signal $S_{QR}$.

Furthermore, as with the signal generating circuit $SG_1$, any of the signal generating circuits $SG_2$–$SG_5$ can be incorporated in a quadrature modulator, a quadrature demodulator, or an image rejection mixer. These three devices, however, are not meant to be restrictive. The above-described signal generating circuits $SG_1$ through $SG_5$ can be incorporated into any wireless communications device that requires the reference phase signal $S_{REF}$ and the quadrature signal $S_{QR}$ to be orthogonal to each other.

While the invention has been described in detail, the foregoing description is in all aspects illustrative and not restrictive. It is understood that numerous other modifications and variations can be devised without departing from the scope of the invention.

What is claimed is:

1. A signal generating circuit which is coupled to a local oscillator for generating a local oscillation signal having a predetermined frequency, the signal generating circuit comprising:

a 90-degree divider for generating, from a first input signal having a predetermined frequency, an intermediate reference phase signal and an intermediate quadrature signal that is orthogonal in phase to the intermediate reference phase signal;

a first mixer for generating a reference phase signal by mixing a second input signal having a predetermined frequency and the intermediate reference phase signal generated by the 90-degree divider;

a second mixer for generating a quadrature signal by mixing a third input signal having a predetermined frequency and the intermediate quadrature signal generated by the 90-degree divider;

a shifter for generating a shift signal by shifting a phase of the local oscillation signal generated by the local oscillator by a predetermined amount; and a divider for dividing the shift signal generated by the shifter into two signals being in-phase with each other, and outputting the two signals to the first and second mixers, respectively, wherein the 90-degree divider generates the intermediate reference phase signal and the intermediate quadrature signal by taking the local oscillation signal generated by the local oscillator as the first input signal, wherein the first mixer generates the reference phase signal by taking the shift signal supplied by the divider as the second input signal, and wherein the second mixer generates the quadrature signal by taking the shift signal supplied by the divider as the third input signal.

2. The signal generating circuit according to claim 1, wherein the 90-degree divider is constructed by an RC shifter including a resistor and a capacitor.

3. The signal generating circuit according to claim 1, wherein the 90-degree divider is constructed by a polyphase filter.

4. The signal generating circuit according to claim 1, wherein the 90-degree divider is constructed by a multi-stage polyphase filter.

5. The signal generating circuit according to claim 1, wherein the signal generating circuit is incorporated in a quadrature modulator.

6. The signal generating circuit according to claim 1, wherein the signal generating circuit is incorporated in a quadrature demodulator.

7. The signal generating circuit according to claim 1, wherein the signal generating circuit is incorporated in an image rejection mixer.

8. The signal generating circuit according to claim 1, wherein the signal generating circuit is incorporated in a wireless communications device.

9. A signal generating circuit, comprising:

a 90-degree divider for generating, from a first input signal having a predetermined frequency, an intermediate reference phase signal and an intermediate quadrature signal that is orthogonal in phase to the intermediate reference phase signal;

a first mixer for generating a reference phase signal by mixing a second input signal having a predetermined frequency and the intermediate reference phase signal generated by the 90-degree divider; and a second mixer for generating a quadrature signal by mixing a third input signal having a predetermined frequency and the intermediate quadrature signal generated by the 90-degree divider, wherein the signal generating circuit is coupled to a local oscillator for generating a local oscillation signal having a predetermined frequency, wherein the signal generating circuit further comprises:
a divider for dividing the local oscillation signal generated by the local oscillator into two signals, and outputting the two signals to the first and second mixers, respectively; and
a shifter for shifting a phase of the local oscillation signal generated by the local oscillator by a predetermined amount,
wherein the 90-degree divider generates the intermediate reference phase signal and the intermediate quadrature signal by taking the local oscillation signal generated by the shifter as the first input signal,
wherein the first mixer generates the reference phase signal by taking the local oscillation signal supplied by the divider as the second input signal, and
wherein the second mixer generates the quadrature signal by taking the local oscillation signal supplied by the divider as the third input signal.

10. The signal generating circuit according to claim 9, wherein the 90-degree divider is constructed by an RC shifter including a resistor and a capacitor.

11. The signal generating circuit according to claim 9, wherein the 90-degree divider is constructed by a polyphase filter.

12. The signal generating circuit according to claim 9, wherein the 90-degree divider is constructed by a multistage polyphase filter.

13. The signal generating circuit according to claim 9, wherein the signal generating circuit is incorporated in a quadrature modulator.

14. The signal generating circuit according to claim 9, wherein the signal generating circuit is incorporated in a quadrature demodulator.

15. The signal generating circuit according to claim 9, wherein the signal generating circuit is incorporated in an image rejection mixer.

16. The signal generating circuit according to claim 9, wherein the signal generating circuit is incorporated in a wireless communications device.

17. A signal generating circuit, comprising:
a first 90-degree divider for generating, from a first input signal having a predetermined frequency, an intermediate reference phase signal and an intermediate quadrature signal that is orthogonal in phase to the intermediate reference phase signal;
a first mixer for generating a reference phase signal by mixing a second input signal having a predetermined frequency and the intermediate reference phase signal generated by the first 90-degree divider; and
a second mixer for generating a quadrature signal by mixing a third input signal having a predetermined frequency and the intermediate quadrature signal generated by the first 90-degree divider,
wherein the signal generating circuit is coupled to a local oscillator for generating a local oscillation signal having a predetermined frequency,
wherein the signal generating circuit further comprises:
a second 90-degree divider for generating, from the local oscillation signal generated by the local oscillator, first and second signals that are different in phase from each other by 90 degrees;
a combiner for generating a composite signal by combining the first and second signals generated by the second 90-degree divider; and
a divider for dividing the composite signal generated by the combiner into two signals, and outputting the two signals to the first and second mixers, respectively,
wherein the first 90-degree divider generates the intermediate reference phase signal and the intermediate quadrature signal by taking the local oscillation signal generated by the local oscillator as the first input signal,
wherein the first mixer generates the reference phase signal by taking the composite signal supplied by the divider as the second input signal, and
wherein the second mixer generates the quadrature signal by taking the composite signal supplied by the divider as the third input signal.

18. A signal generating circuit, comprising:
a 90-degree divider for generating, from a first input signal having a predetermined frequency, an intermediate reference phase signal and an intermediate quadrature signal that is orthogonal in phase to the intermediate reference phase signal;
a first mixer for generating a reference phase signal by mixing a second input signal having a predetermined frequency and the intermediate reference phase signal generated by the 90-degree divider; and
a second mixer for generating a quadrature signal by mixing a third input signal having a predetermined frequency and the intermediate quadrature signal generated by the 90-degree divider,
wherein the signal generating circuit is coupled to a local oscillator for generating a local oscillation signal having a predetermined frequency,
wherein the 90-degree divider generates the intermediate reference phase signal and the intermediate quadrature signal by taking the local oscillation signal generated by the local oscillator as the first input signal,
wherein the signal generating circuit further comprises:
a first divider for dividing the intermediate reference phase signal generated by the 90-degree divider into two;
a second divider for dividing the intermediate quadrature signal generated by the 90-degree divider into two;
an adder for generating an addition signal by adding the intermediate reference phase signal and the intermediate quadrature signal divided by the first and second dividers, and
a third divider for dividing the addition signal generated by the adder into two signals, and outputting the two signals to the first and second mixers,
wherein the first mixer generates the reference phase signal by mixing the addition signal supplied by the third divider as the second input signal and the intermediate reference phase signal divided by the first divider, and
wherein the second mixer generates the quadrature signal by mixing the addition signal divided by the third divider as the third input signal and the intermediate quadrature signal divided by the second divider.

19. A signal generating circuit, comprising:
a 90-degree divider for generating, from a first input signal having a predetermined frequency, an intermediate reference phase signal and an intermediate quadrature signal that is orthogonal in phase to the intermediate reference phase signal;

a first mixer for generating a reference phase signal by mixing a second input signal having a predetermined frequency and the intermediate reference phase signal generated by the 90-degree divider; and a second mixer for generating a quadrature signal by mixing a third input signal having a predetermined frequency and the intermediate quadrature signal generated by the 90-degree divider, wherein the signal generating circuit is coupled to a local oscillator for generating a local oscillation signal having a predetermined frequency, wherein the 90-degree divider generates the intermediate reference phase signal and the intermediate quadrature signal by taking the local oscillation signal generated by the local oscillator as the first input signal, wherein the signal generating circuit further comprises:

a first divider for dividing the intermediate reference phase signal generated by the 90-degree divider into two;

a first amplifier for amplifying the intermediate reference phase signal divided by the first divider, and outputting the amplified intermediate reference phase signal to the first mixer;

a second amplifier for amplifying the intermediate reference phase signal divided by the first divider;

a second divider for dividing the intermediate quadrature signal generated by the 90-degree divider;

a third amplifier for amplifying the intermediate quadrature signal divided by the second divider, and outputting the amplified intermediate quadrature signal to the second mixer;

a fourth amplifier for amplifying the intermediate quadrature signal divided by the second divider;

a combiner for generating a composite signal by combining the intermediate reference phase signal and the intermediate quadrature signal amplified by the second and fourth amplifiers; and a third divider for dividing the composite signal generated by the combiner into two signals, and outputting the two signals to the first and second mixers, wherein the first mixer generates the reference phase signal by mixing the composite signal supplied by the third divider as the second input signal and the intermediate reference phase signal amplified by the first amplifier, and wherein the second mixer generates the quadrature signal by mixing the composite signal supplied by the third divider as the third input signal and the intermediate quadrature signal amplified by the third amplifier.

20. A signal generating circuit being coupled to a local oscillator for generating a local oscillation signal having a predetermined frequency, the signal generating circuit comprising:

a 90-degree divider for generating, from the local oscillation signal generated by the local oscillator, an intermediate reference phase signal and an intermediate quadrature signal that is orthogonal in phase to the intermediate reference phase signal;

a first divider for dividing the intermediate reference phase signal generated by the 90-degree divider into two;

a second divider for dividing the intermediate quadrature signal generated by the 90-degree divider into two;

a third divider for dividing the intermediate reference phase signal divided by the first divider into two;

a fourth divider for dividing the intermediate quadrature signal divided by the second divider into two;

a subtractor for generating a subtraction signal by subtracting the intermediate reference phase signal divided by the first divider from the intermediate quadrature signal divided by the second divider;

an adder for generating an addition signal by adding the intermediate reference phase signal divided by the third divider and the intermediate quadrature signal divided by the fourth divider;

a first mixer for generating a reference phase signal by mixing the intermediate reference phase signal divided by the third divider and the intermediate quadrature signal divided by the fourth divider; and a second mixer for generating a quadrature signal that is orthogonal in phase to the reference phase signal generated by the first mixer by mixing the subtraction signal generated by the subtractor and the addition signal generated by the adder.

21. The signal generating circuit according to claim 20, further comprising an amplitude adjusting section for adjusting an amplitude of the reference phase signal generated by the first mixer and an amplitude of the quadrature signal generated by the second mixer to be substantially a same value.

22. The signal generating circuit according to claim 21, wherein the amplitude adjusting section includes:

a first limiter amplifier for adjusting the amplitude of the reference phase signal generated by the first mixer; and a second limiter amplifier for adjusting the amplitude of the quadrature signal generated by the second mixer.

* * * * *